US011349440B2

(12) United States Patent
Ismail et al.

(10) Patent No.: US 11,349,440 B2
(45) Date of Patent: May 31, 2022

(54) EXTENDING BANDWIDTH OF ANALOG CIRCUITS USING FERROELECTRIC NEGATIVE CAPACITORS

(71) Applicant: Apple Inc., Cupertino, CA (US)

(72) Inventors: Aly Ismail, San Diego, CA (US); Amr O Haggag, Pleasanton, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/033,008

(22) Filed: Sep. 25, 2020

(65) Prior Publication Data
US 2022/0103135 A1 Mar. 31, 2022

(51) Int. Cl.
| H03F 1/42 | (2006.01) |
| H04R 3/00 | (2006.01) |
| H03F 3/00 | (2006.01) |
| H03F 1/56 | (2006.01) |

(52) U.S. Cl.
CPC ............... *H03F 1/42* (2013.01); *H03F 3/005* (2013.01)

(58) Field of Classification Search
CPC ............... H03F 1/42; H03F 3/005; H03F 1/08
USPC .................... 330/9, 277, 285, 296
See application file for complete search history.

(56) References Cited

U.S. PATENT DOCUMENTS

| 7,812,568 B2 | 10/2010 | Yonezawa |
| 8,059,837 B2* | 11/2011 | Wu .......................... H04R 3/06 381/113 |
| 9,154,091 B2* | 10/2015 | Tsui .................... H03F 3/45179 |

FOREIGN PATENT DOCUMENTS

| JP | 2012-142803 A | 7/2012 |
| JP | 2012-147245 A | 8/2012 |
| WO | WO 2009/108391 A1 | 9/2009 |

* cited by examiner

*Primary Examiner* — Hieu P Nguyen
(74) *Attorney, Agent, or Firm* — Fenwick & West LLP

(57) ABSTRACT

Embodiments relate to a circuit implementation for extending the bandwidth of an amplifier. The extended bandwidth amplifier includes an amplifier coupled between an input node and an output node of the extended bandwidth amplifier. The amplifier has an input capacitance and an output capacitance. The extended bandwidth amplifier additionally includes a first digitally-trimmable negative-capacitance capacitor coupled between the input node of the extended bandwidth amplifier and a power supply terminal. The digitally-trimmable negative-capacitance capacitor includes a first branch, a second branch, and a controller. The first branch includes a first capacitor having a first negative capacitance, and a first switch. The second branch includes a second capacitor having a second negative capacitance, and a second switch. The controller is configured to turn on the first switch and the second switch based on the input capacitance of the amplifier.

17 Claims, 10 Drawing Sheets

EXTENDING BANDWIDTH OF ANALOG CIRCUITS USING FERROELECTRIC NEGATIVE CAPACITORS

BACKGROUND

1. Field of the Disclosure

The present disclosure relates to amplifiers circuits, and more specifically to increasing the bandwidth of an amplifier circuit by compensating parasitic capacitances of the amplifier circuit.

2. Description of the Related Art

As the operating frequency of a circuit increases, the parasitic capacitances of the components used to implement the circuit becomes more and more significant. For instance, circuits that are implemented using transistors are limited in bandwidth by the intrinsic parasitic capacitances of those transistors. Reducing the size of the transistor can help reduce some of those parasitic capacitances. However, there is a limit on how small a transistor can be made using available manufacturing techniques. Moreover, as the size of the transistor reduces, the effects of reducing the size of the transistor on the magnitude of those parasitic capacitances diminish. As such, this diminishing return in reduction of parasitic capacitances and the difficulty in further reducing the size of a transistor greatly limits the frequencies at which current circuits can operate.

SUMMARY

Embodiments relate to a circuit implementation for extending the bandwidth of an amplifier. The extended bandwidth amplifier includes an amplifier coupled between an input node and an output node of the extended bandwidth amplifier. The amplifier has an input capacitance and an output capacitance. The extended bandwidth amplifier additionally includes a first digitally-trimmable negative-capacitance capacitor coupled between the input node of the extended bandwidth amplifier and a power supply terminal. The digitally-trimmable negative-capacitance capacitor includes a first branch, a second branch, and a controller. The first branch includes a first capacitor having a first negative capacitance, and a first switch. The second branch includes a second capacitor having a second negative capacitance, and a second switch. The controller is configured to turn on the first switch and the second switch based on the input capacitance of the amplifier.

The figures depict, and the detail description describes, various non-limiting embodiments for purposes of illustration only.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, the described embodiments may be practiced without these specific details. In other instances, well-known methods, procedures, components, circuits, and networks have not been described in detail so as not to unnecessarily obscure aspects of the embodiments.

Embodiments relate to a power monitoring circuit. The power monitoring circuit includes a divider circuit that generates a reference voltage that is inversely proportional to a regulator voltage. Moreover, the power monitoring circuit includes an integrator that generates an integrator voltage by integrating one or more regulator currents. The power monitoring circuit additionally includes a comparator for comparing the output of the divider circuit and the output of the integrator. The comparator of the power monitoring circuit generates an overpower signal in response to the integrator voltage being larger than the reference voltage Exemplary Electronic Device Embodiments of electronic devices, user interfaces for such devices, and associated processes for using such devices are described. In some embodiments, the device is a portable communications device, such as a mobile telephone, that also contains other functions, such as personal digital assistant (PDA) and/or music player functions. Exemplary embodiments of portable multifunction devices include, without limitation, the iPhone®, iPod Touch®, Apple Watch®, and iPad® devices from Apple Inc. of Cupertino, Calif. Other portable electronic devices, such as wearables, laptops or tablet computers, are optionally used. In some embodiments, the device is not a portable communications device, but is a desktop computer or other computing device that is not designed for portable use. In some embodiments, the disclosed electronic device may include a touch sensitive surface (e.g., a touch screen display and/or a touch pad). An example electronic device described below in conjunction with FIG. 1 (e.g., device 100) may include a touch-sensitive surface for receiving user input. The electronic device may also include one or more other physical user-interface devices, such as a physical keyboard, a mouse and/or a joystick.

Figure 1:
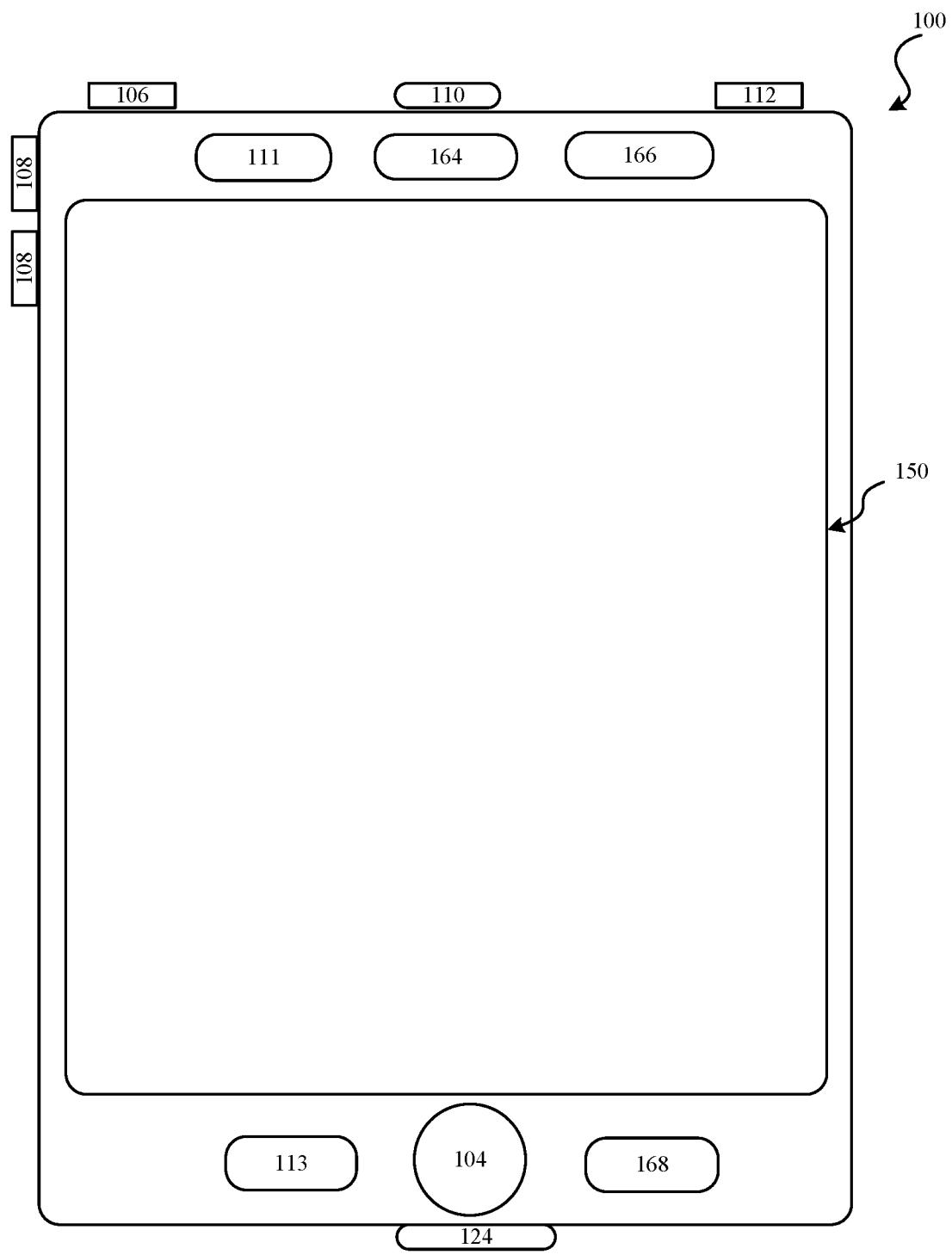
FIG. 1 is a high-level diagram of an electronic device, according to one embodiment.

FIG. 1 is a high-level diagram of an electronic device 100, according to one embodiment. Device 100 may include one or more physical buttons, such as a "home" or menu button 104. Menu button 104 is, for example, used to navigate to any application in a set of applications that are executed on device 100. In some embodiments, menu button 104 includes a fingerprint sensor that identifies a fingerprint on menu button 104. The fingerprint sensor may be used to determine whether a finger on menu button 104 has a fingerprint that matches a fingerprint stored for unlocking device 100. Alternatively, in some embodiments, menu button 104 is implemented as a soft key in a graphical user interface (GUI) displayed on a touch screen.

In some embodiments, device 100 includes touch screen 150, menu button 104, push button 106 for powering the device on/off and locking the device, volume adjustment buttons 108, Subscriber Identity Module (SIM) card slot 110, head set jack 112, and docking/charging external port 124. Push button 106 may be used to turn the power on/off on the device by depressing the button and holding the button in the depressed state for a predefined time interval; to lock the device by depressing the button and releasing the button before the predefined time interval has elapsed; and/or to unlock the device or initiate an unlock process. In an alternative embodiment, device 100 also accepts verbal input for activation or deactivation of some functions through microphone 113. The device 100 includes various components including, but not limited to, a memory (which may include one or more computer readable storage mediums), a memory controller, one or more central processing units (CPUs), a peripherals interface, an RF circuitry, an audio circuitry, speaker 111, microphone 113, input/output (I/O) subsystem, and other input or control devices. Device 100 may include one or more image sensors 164, one or more proximity sensors 166, and one or more accelerometers 168. The device 100 may include components not shown in FIG. 1.

Device 100 is only one example of an electronic device, and device 100 may have more or fewer components than listed above, some of which may be combined into a component or have a different configuration or arrangement. The various components of device 100 listed above are embodied in hardware, software, firmware or a combination thereof, including one or more signal processing and/or application specific integrated circuits (ASICs). Device 100 may include one or more current sense circuits described herein.

Amplifier Circuit

Figure 2A:
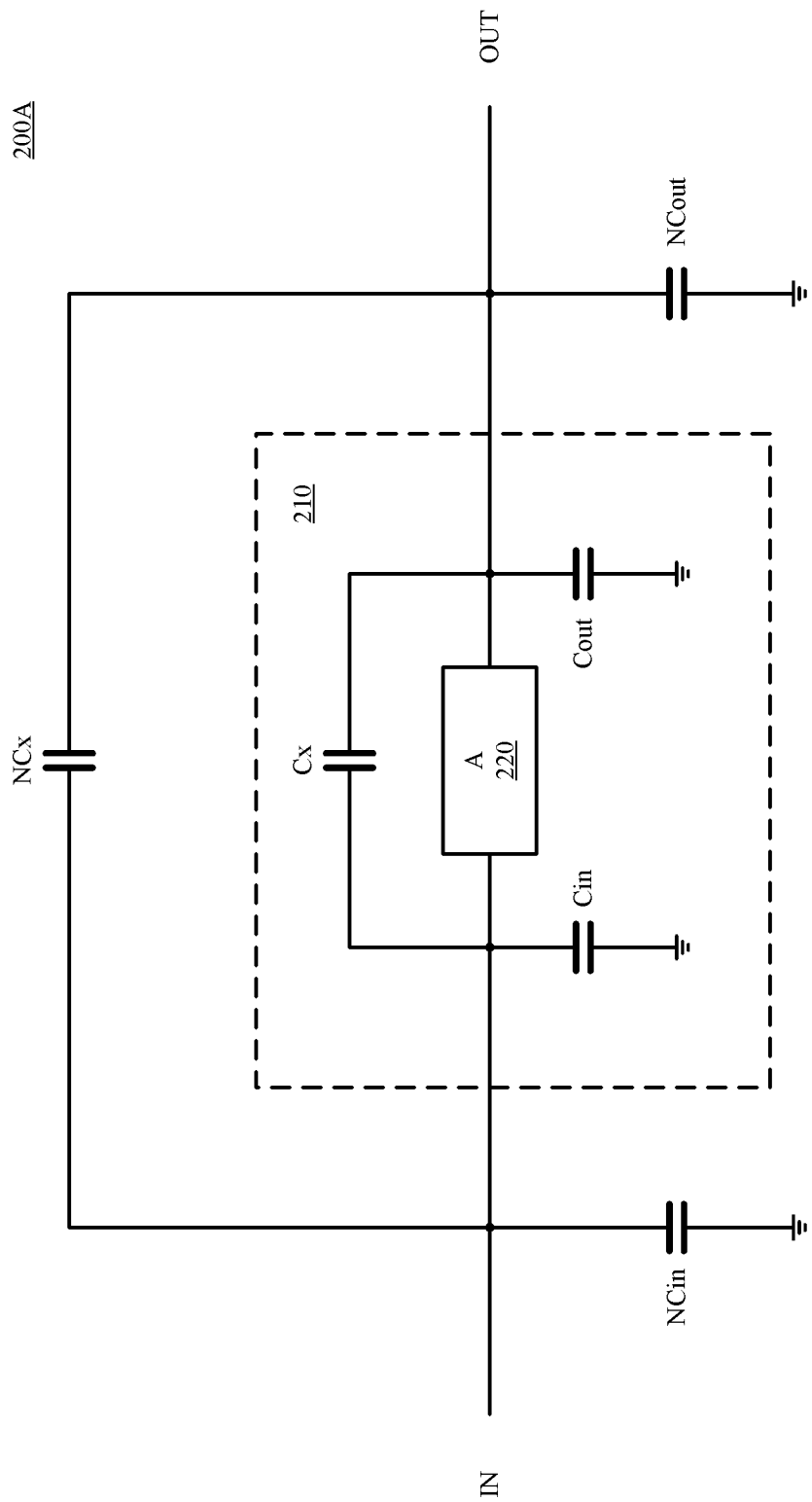
FIG. 2A illustrates a block diagram of an extended bandwidth amplifier circuit, according to one embodiment.

FIG. 2A illustrates a block diagram of an extended bandwidth amplifier circuit 200A, according to one embodiment. The extended bandwidth amplifier 200A may include, among other components, an amplifier 210 and one or more negative capacitance (NC) capacitors.

The amplifier 210 can be modeled as an ideal amplifier 220 and one or more capacitances. In some embodiments, the model for the amplifier 210 may include other components such as an input resistance, an input inductance, an output resistance, and an output inductance. The amplifier 210 is connected between a first node (IN) of the extended bandwidth amplifier, and a second node (OUT) of the extended bandwidth amplifier.

The ideal amplifier 220 models the gain of the amplifier 210. The ideal amplifier 220 receives an input signal IN and generates an output signal OUT by amplifying the input signal IN by an amplification factor or gain A. For example, the ideal amplifier 220 may output a signal OUT having a voltage equal to the voltage of the input signal IN multiplied by the gain A.

The amplifier 210 additionally has one or more capacitances, such as an input capacitance Cin, and an output capacitance Cout. The input capacitance Cin is the capacitance seen at the input terminal of the amplifier 210. The output capacitance Cout is the capacitance seen at the output of the amplifier 210. Moreover, the model of the amplifier 210 may include a third capacitor Cx between the input and the output terminals of the amplifier 210.

The capacitances of the amplifier 210 may be present due to parasitic capacitances of the components that implement the amplifier 210. For example, the input capacitance Cin or the output capacitance Cout may partially be due to a gate to source capacitance Cgs or a gate to drain capacitance Cgd of a transistor used to implement the amplifier 210. Additionally, the input capacitance Cin or the output capacitance Cout may be due to a capacitance to ground of a metal trace used to interconnect the different components of the amplifier 210. Although improvements in manufacturing technology may reduce the parasitic capacitances present in a circuit, as the frequency of the signal used with the amplifier 210 increases, even a small amount of parasitic capacitance can significantly degrade the performance of the amplifier 210.

The extended bandwidth amplifier 200A compensates the capacitances of the amplifier 210 using one or more negative capacitance (NC) capacitors. For example, to implement a NC capacitor, a capacitor structure using a ferroelectric material separating two conducting plates (e.g., a metal-ferroelectric-metal capacitor, or a metal-ferroelectric-oxide-metal capacitor) may be used. In some embodiments, the NC capacitor behaves consistent with a negative capacitance only in a specific bias range. For example, the NC capacitor may have a varying capacitance value, which becomes negative at or near a 0V DC bias point.

The extended bandwidth amplifier 200A may include an input NC capacitor NCin compensating the input capacitance Cin of the amplifier 210 and an output NC capacitor NCout compensating the output capacitance Cout of the amplifier 210. Moreover, the extended bandwidth amplifier 200A may include a third NC capacitor NCx compensating the third capacitor Cx of the amplifier 210.

The input NC capacitor NCin is connected in parallel with the input capacitance Cin of the amplifier 210. That is, the input NC capacitor NCin is connected between the input terminal of the amplifier 210 and a power supply (e.g., ground). Therefore, the effective input capacitance $C_{T_{in}}$ of the extended bandwidth amplifier 200A is equal to:

$$C_{T_{in}} = NC_{in} + C_{in} \quad (1)$$

Since the value of NCin is negative, the resulting capacitance would be equal to:

$$C_{T_{in}} = |C_{in}| - |NC_{in}| \quad (2)$$

As such, the effective input capacitance $C_{T_{in}}$ of the extended bandwidth amplifier 200A can be compensated by a capacitor with a negative capacitance having a magnitude that is close to the magnitude of the input capacitance Cin of the amplifier 210.

Similarly, the output NC capacitor NCout is connected in parallel with the output capacitance Cout of the amplifier 210. That is, the output NC capacitor NCout is connected between the output terminal of the amplifier 210 and a power supply (e.g., ground). Therefore, the effective output capacitance $C_{T_{out}}$ of the extended bandwidth amplifier 200A is equal to:

$$C_{T_{out}} = NC_{out} + C_{out} \quad (3)$$

Since the value of NCout is negative, the resulting capacitance would be equal to:

$$C_{T_{out}} = |C_{out}| - |NC_{out}| \quad (4)$$

As such, the effective output capacitance $C_{T_{out}}$ of the extended bandwidth amplifier 200A can be compensated by a capacitor with a negative capacitance having a magnitude that is close to the magnitude of the output capacitance Cout of the amplifier 210.

Finally, the third NC capacitor NCx is connected in parallel with the third capacitance Cx of the amplifier 210. That is, the third NC capacitor NCx is connected between the input terminal of the amplifier 210 and the output terminal of the amplifier 210. Therefore, the effective capacitance $C_{T_x}$ between the input and output of the extended bandwidth amplifier 200A is equal to:

$$C_{T_x} = NC_x + C_x \tag{5}$$

Since the value of NCx is negative, the resulting capacitance would be equal to:

$$C_{T_x} = |C_x| - |NC_x| \tag{6}$$

As such, the effective capacitance $C_{T_x}$ between the input and output the extended bandwidth amplifier 200A can be compensated by a capacitor with a negative capacitance having a magnitude that is close to the magnitude of the third capacitance Cx of the amplifier 210.

In other embodiments, the third capacitance Cx is compensated by a portion of the input NC capacitor NCin and a portion of the output NC capacitor NCout.

Moreover, in some embodiments, the NC capacitors are digitally-trimmable. That is, the capacitance value of the NC capacitors may be set to account for variations in the actual value of the capacitances of the amplifier 210. An example of a digitally-trimmable negative-capacitance (NC) capacitor is described below in conjunction with FIG. 3.

Figure 2B:
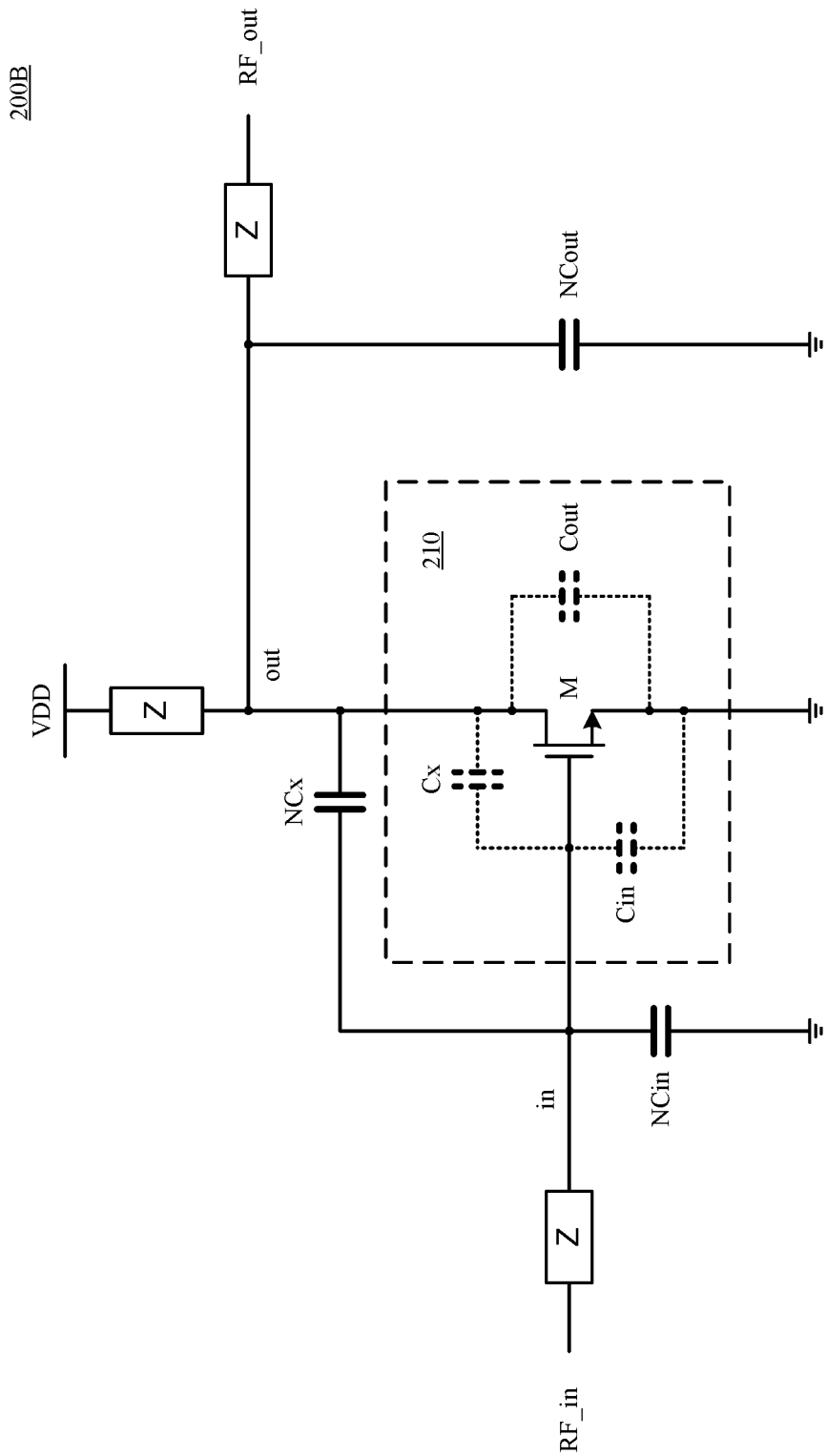
FIG. 2B and FIG. 2C are examples of extended bandwidth amplifier circuits, according to various embodiments.
Figure 2C:
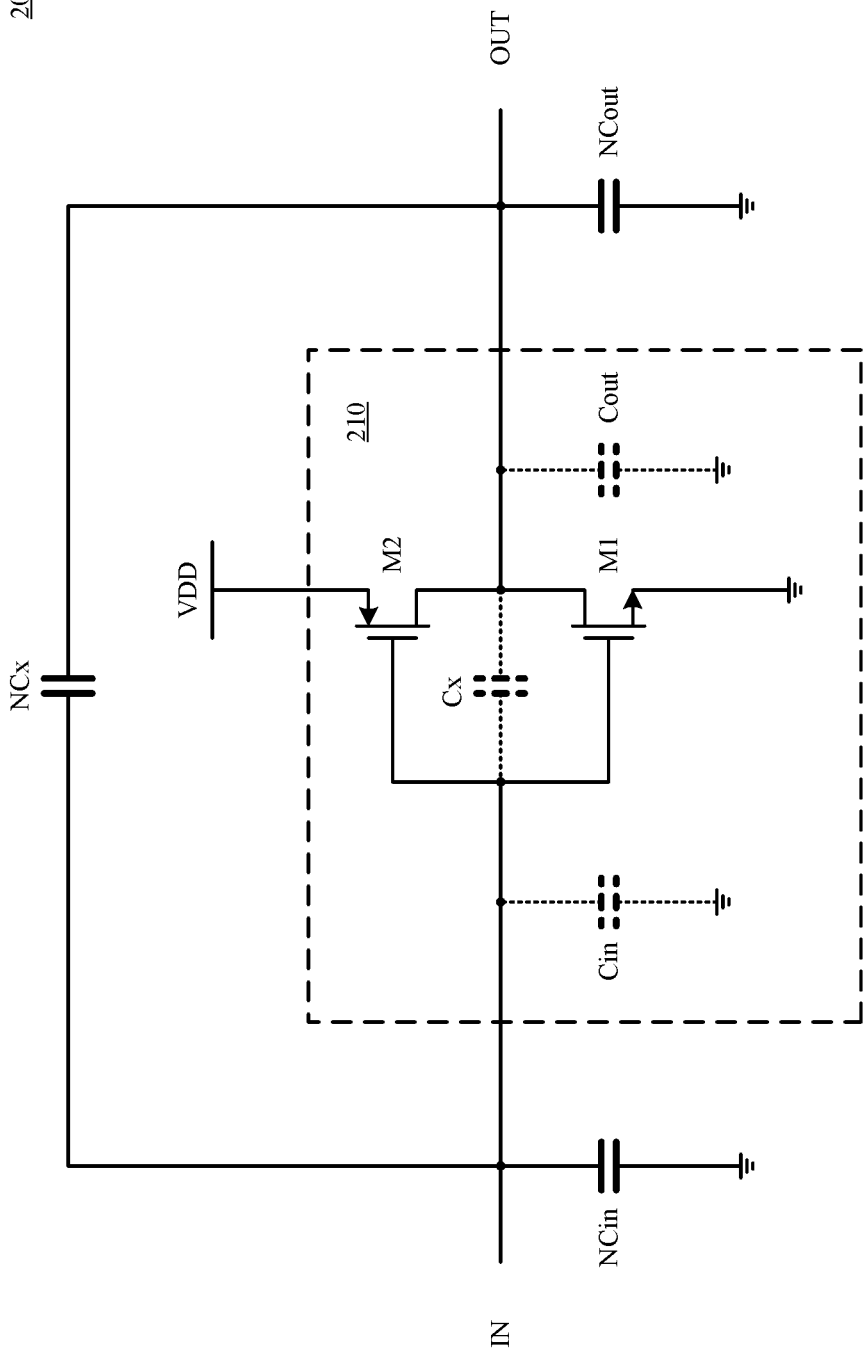

FIG. 2B and FIG. 2C are examples of amplifier circuits, according to various embodiments. FIG. 2B is an example of an amplifier 200B having a single transistor (e.g., a common source amplifier). FIG. 2C is an example of an amplifier 200C having two transistors.

As shown in FIG. 2B, the amplifier 200B includes one transistor M that has parasitic capacitances associated with it. For example, the transistor M has a gate-to-source capacitance, a gate-to-drain capacitance (e.g., due to overlap capacitances), a source-to-body capacitance, a drain-to-body capacitance (e.g., due to junction depletion capacitances), and a gate-to-body capacitance (e.g., due to a gate-channel capacitance and a channel depletion capacitance). Due to one or more parasitic capacitances of the transistor M and other components (such as metal traces used to interconnect the various components), the common source amplifier 200B of FIG. 2B has an input capacitance Cin, an output capacitance Cout, and input-output capacitance Cx. For example, the input capacitance Cin may include the gate-to-source capacitance and the gate-to-body capacitance, the output capacitance Cout may include the drain-to-body capacitance, and the input-output capacitance may include the gate-to-drain capacitance.

FIG. 2C shows an amplifier 200C that includes two transistors M1 and M2, each having parasitic capacitances. In some embodiments, since the amplifier 200C of FIG. 2C has more transistors than the amplifier 200B, the parallel combination of capacitances due to each of the transistors may increase the value of the input capacitance Cin, the output capacitance Cout, and the input-output capacitance Cx. For instance, the input capacitance Cin of FIG. 2C may include the parallel combination of the gate-to-source and gate-to-body capacitances of the first transistor M1, the gate-to-source and gate-to-body capacitances of the second transistor M2. Similarly, the output capacitance Cout of FIG. 2C may include the parallel combination of the drain-to-body capacitance of the first transistor M1, and the drain-to-body capacitance of the second transistor M2.

Digitally-Trimmable Negative-Capacitance Capacitor

Figure 3:
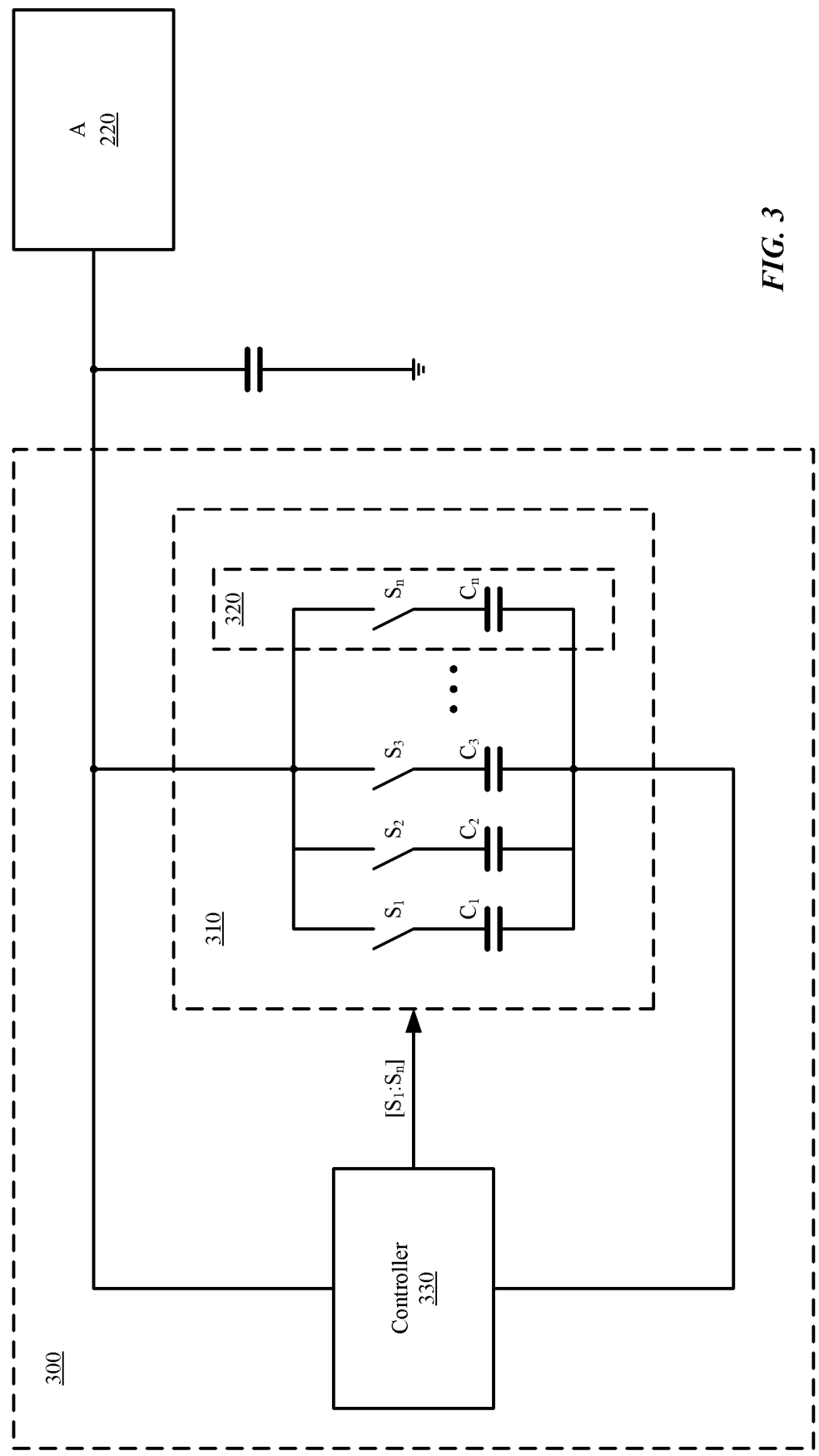
FIG. 3 illustrates a circuit diagram of a digitally-trimmable negative-capacitance (NC) capacitor, according to one embodiment.

FIG. 3 illustrates a circuit diagram of a digitally-trimmable negative-capacitance (NC) capacitor 300, according to one embodiment. The digitally-trimmable NC capacitor 300 includes a capacitor bank 310 having multiple branches 320 connected in parallel and a controller 330.

Each branch 320 of the capacitor bank 310 includes a capacitor C and a switch S. When the switch S of a branch is closed, the capacitor C is connected in parallel to other active branches of the capacitor bank 310, increasing the magnitude of the overall capacitance of the digitally-trimmable NC capacitor 300.

In some embodiments, the equivalent (or overall) capacitance $C_T$ of the digitally-trimmable NC capacitor 300 is equal to:

$$C_T = \sum_{i=1}^{n} S_i \cdot C_i = S_1 \cdot C_1 + S_2 \cdot C_2 + S_3 \cdot C_3 + \ldots + S_n \cdot C_n \tag{7}$$

Where $S_i$ is 0 when the switch of the i-th branch is configured to be open and 1 when the switch of the i-th branch is configured to be closed; and $C_i$ is the capacitance of the capacitor in the i-th branch.

In some embodiments, each capacitor C of each branch has the same capacitance. In other embodiments, the capacitances of the capacitors of each branch are designed to have different values. For example, in some embodiments, the capacitance of the second branch is designed to be double the capacitance of the first branch. Moreover, the capacitance of the i-th branch is configured to be double the capacitance of the previous ((i−1)-th) branch. In some embodiments, the capacitance of the i-th branch is configured to be $2^{i-1} \cdot C_1$, where $C_1$ is the capacitance of the first branch of the capacitor bank 310.

The controller 330 generates the configuration signal $[S_1:S_n]$ to control the capacitor bank 310. In some embodiments, the configuration signal $[S_1:S_n]$ is a digital signal. Moreover, in some embodiments, each bit of the configuration signal $[S_1:S_n]$ controls a switch of one branch of the capacitor bank 310. Examples of various implementations of the controller 330 is described in conjunction with FIGS. 4A and 4B. Moreover, a process for configuring the digitally-trimmable NC capacitor 300 is described in conjunction with FIG. 5.

Figure 4A:
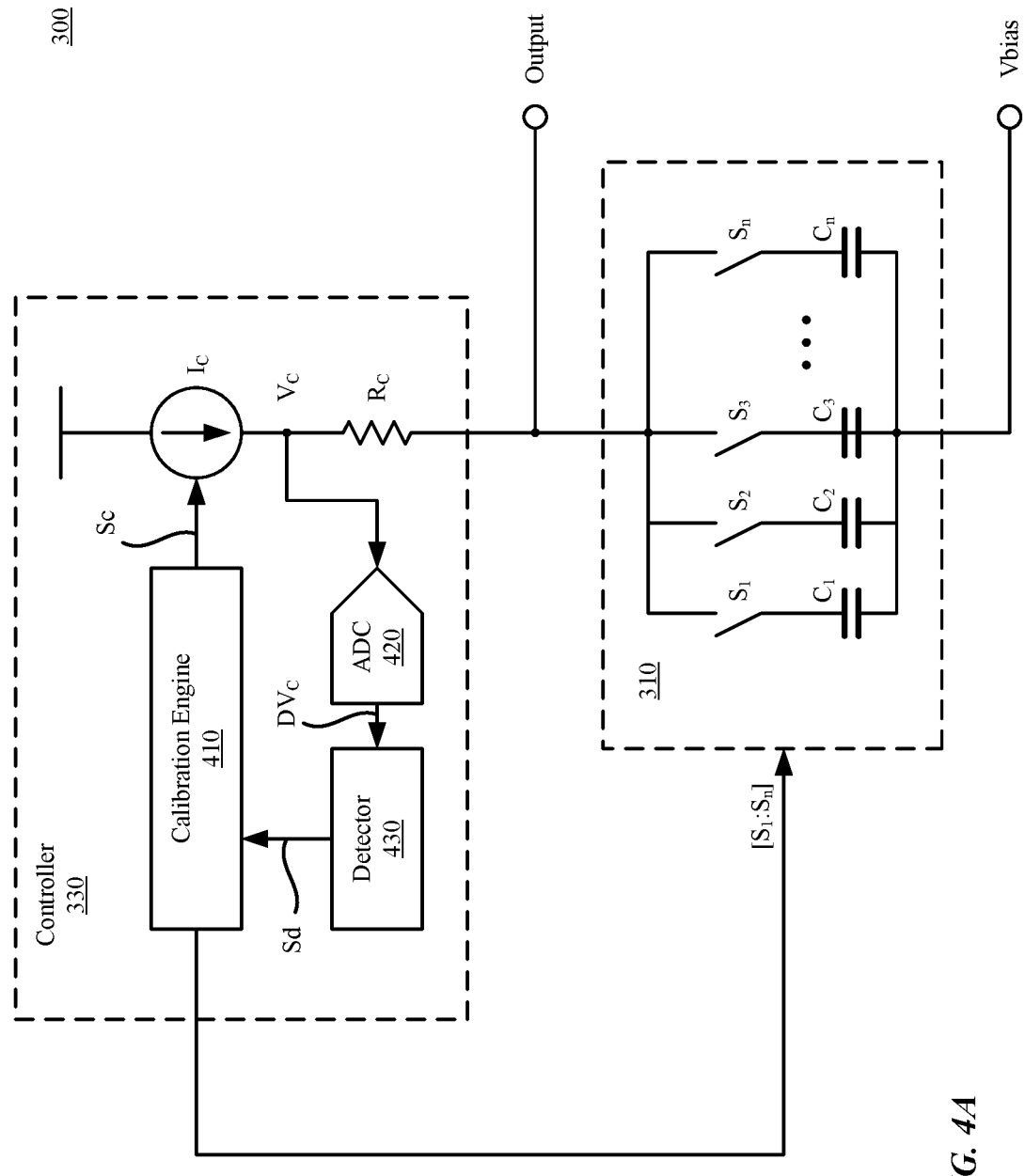
FIG. 4A illustrates an example of a controller for controlling a digitally-trimmable NC capacitor, according to one embodiment.

FIG. 4A illustrates an example of a controller 330 for controlling a digitally-trimmable NC capacitor, according to one embodiment. The controller 330 includes a current source Ic, a resistor Rc, a calibration engine 410, an analog-to-digital converter (ADC) 420, and a detector 430. In this embodiment, the digitally-trimmable NC capacitor 300 receives a bias voltage Vbias at a second terminal. The bias voltage biases the capacitors of each of the branches of the capacitor bank 310 in a negative capacitance region. For instance, the bias voltage Vbias may have a DC voltage level substantially the same as the DC voltage level of the first terminal (output terminal) of the capacitor bank 310.

The current source Ic and the resistor Rc are connected in series. The series combination of the current source Ic and the resistor Rc is then connected to the first terminal of the capacitor bank 310. During a calibration mode, the current source Ic is supplies a test current to one or more branches of the capacitor bank 310.

The ADC 420 is connected to an end of the resistor Rc. The ADC 420 is configured to sense a voltage Vc across the resistor Rc. The ADC 420 converts the sensed analog voltage Vc into a digital representation DVc of the sensed analog voltage Vc.

The detector 430 receives the digital representation DVc of the sensed analog voltage Vc and determines whether a pattern consistent with a negative capacitance is present. For example, the detector 430 determines whether a decrease in the sensed analog voltage Vc is present. If the detector 430 detects a drop in the sensed analog voltage Vc (e.g., by detecting a negative change in the received digital value from the ADC 420), the detector 430 outputs a Sd signal to the calibration engine 410.

The calibration engine 410 generates a signal Sc to control the current source Ic and configuration signal $[S_1:S_n]$ to control the switches of each branch of the capacitor bank 310. In some embodiments, the calibration engine 410 receives a calibration mode signal from an external controller indicating the start of a calibration process. During the calibration process, the calibration engine turns on the current source Ic and controls the current source Ic to output a predetermined amount of current. In some embodiments, the calibration engine 410 further generates signals to control the ADC 420 and/or the detector 430. For example, ADC 420 and the detector 430 may be turned off during normal operation of the amplifier circuit and are turned on during the calibration process.

In some embodiments, the calibration engine 410 includes a memory or a register to store the configuration signal $[S_1:S_n]$. For example, the calibration engine may include an n-bit register storing the n-bit configuration signal $[S_1:S_n]$. After the calibration is complete, the calibration engine 410 may store the configuration signal in the register for later use by the digitally-trimmable NC capacitor 300. That is, during normal operation, the digitally-trimmable NC capacitor 300 has a calibrated capacitance by controlling the switches of each branch of the capacitor bank 310 based on the value stored in the memory or register of the calibration engine 410.

In some embodiments, the memory of the calibration engine 410 may be set to a predetermined value by an external controller. That is, the external controller may send a signal to the calibration engine 410 to overwrite the value stored in the memory or register.

In yet other embodiments, instead of having a memory, the calibration engine 410 communicates with the external controller to control the capacitor bank 310. That is, the digitally-trimmable NC capacitor 300 may be controlled by the external controller, and the external controller may change the configuration signal $[S_1:S_n]$ based on an output of the calibration engine 410. For example, the calibration engine 410 may output a signal indicative of the detection of a negative capacitance. The external controller then receives the output signal from the calibration engine 410 and modifies the configuration signal $[S_1:S_n]$ for controlling the capacitor bank 310 of the digitally-trimmable NC capacitor 300 based on the output signal. In this embodiment, the external controller may include a memory or register for storing the configuration signal $[S_1:S_n]$ for controlling the capacitor bank 310 of the digitally-trimmable NC capacitor 300.

Figure 4B:
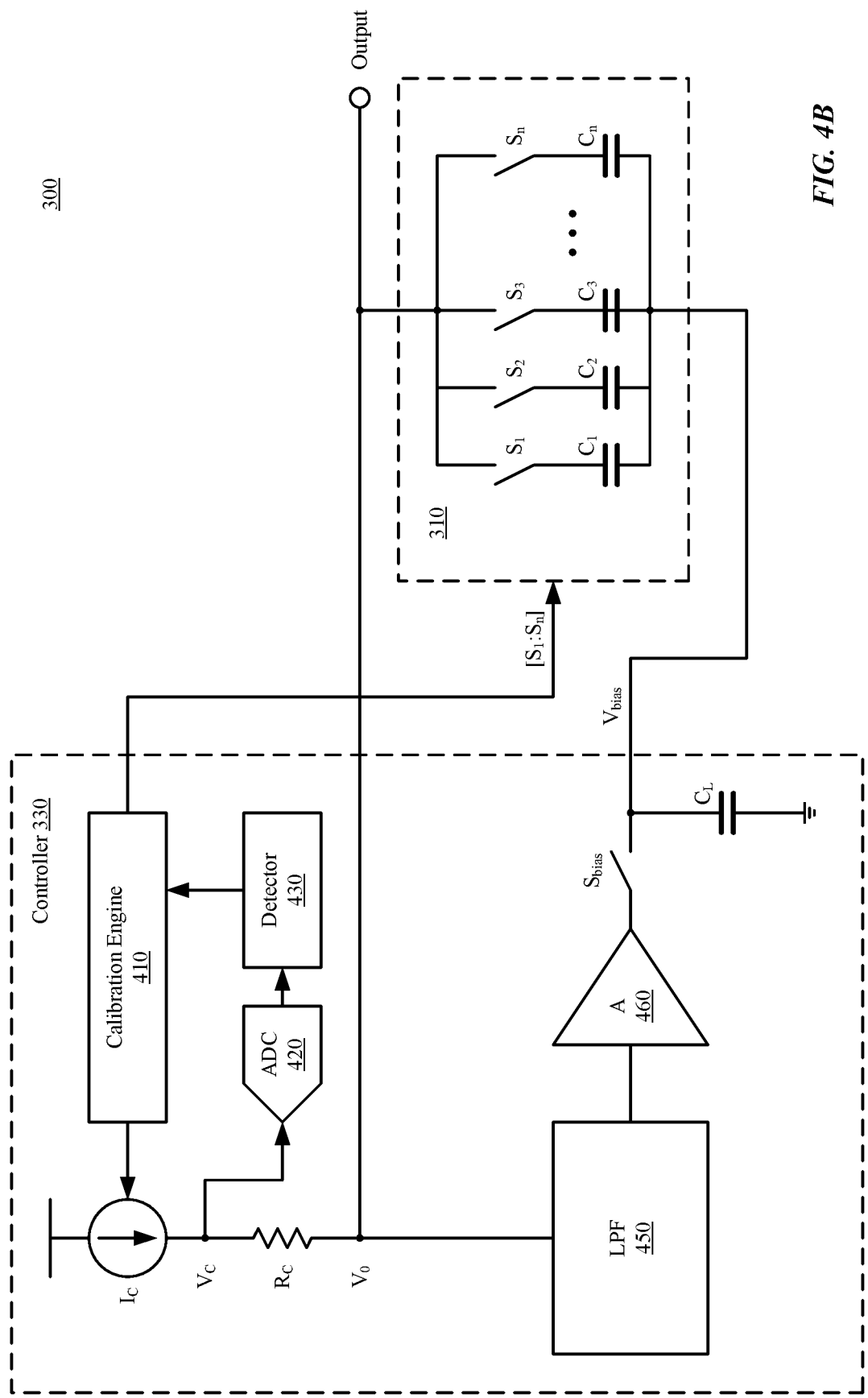
FIG. 4B illustrates another example of a controller for controlling a digitally-trimmable negative-capacitance capacitor, according to one embodiment.

FIG. 4B illustrates another example of a controller 330 for controlling a digitally-trimmable NC capacitor 310, according to one embodiment. The controller 330 of FIG. 4B includes circuitry for biasing the digitally-trimmable NC capacitor 300. That is, instead of having an external bias voltage for biasing the digitally-trimmable NC capacitor 300, the biasing voltage is generated internally by the controller 330.

In some embodiments, the biasing circuit includes a low pass filter (LPF) 450 and an amplifier 460. In some embodiments, biasing circuit further includes a capacitor $C_L$. The amplifier 460 may be a unity gain amplifier. As such, the LPF 450 removes high frequency signals from the first terminal of the capacitor bank 310, and the unity gain amplifier 460 generates a signal having a substantially similar voltage output of the LPF 450. The unity gain amplifier 460 may isolate the first terminal of the capacitor bank 310 form the second terminal of the capacitor bank 310. Moreover, the unity gain amplifier 460 may generate the bias voltage $V_{bias}$ by generating a current to charge capacitor $C_L$ until the voltage across the capacitor $C_L$ is substantially equal to the DC voltage $V_0$ at the first terminal of the capacitor bank 310. The capacitor $C_L$ provides a virtual ground to the capacitor bank 310 and holds the bias voltage $V_{bias}$ throughout the calibration process and/or during the operation of the extended bandwidth amplifier 200. By holding a bias voltage $V_{bias}$, the capacitor $C_L$ biases the capacitors of the capacitor bank 310 in a region having a negative capacitance.

In some embodiments, the controller 330 further includes a switch $S_{bias}$ at the output of the unity gain amplifier 460. The switch $S_{bias}$ is switched on (or closed) to charge the capacitor $C_L$. In some embodiments, the capacitor $C_L$ is charged at the start of the calibration process (or before the calibration process begins). In some embodiments, the switch $S_{bias}$ is kept on for a predetermined amount of time. In other embodiments, the switch $S_{bias}$ is kept on until capacitor $C_L$ reaches a preset voltage level. After the capacitor $C_L$ is charged, the switch $S_{bias}$ is closed to disconnect the LPF 450 and the unity gain amplifier 460 from the second terminal of the capacitor bank 310.

Figure 5:
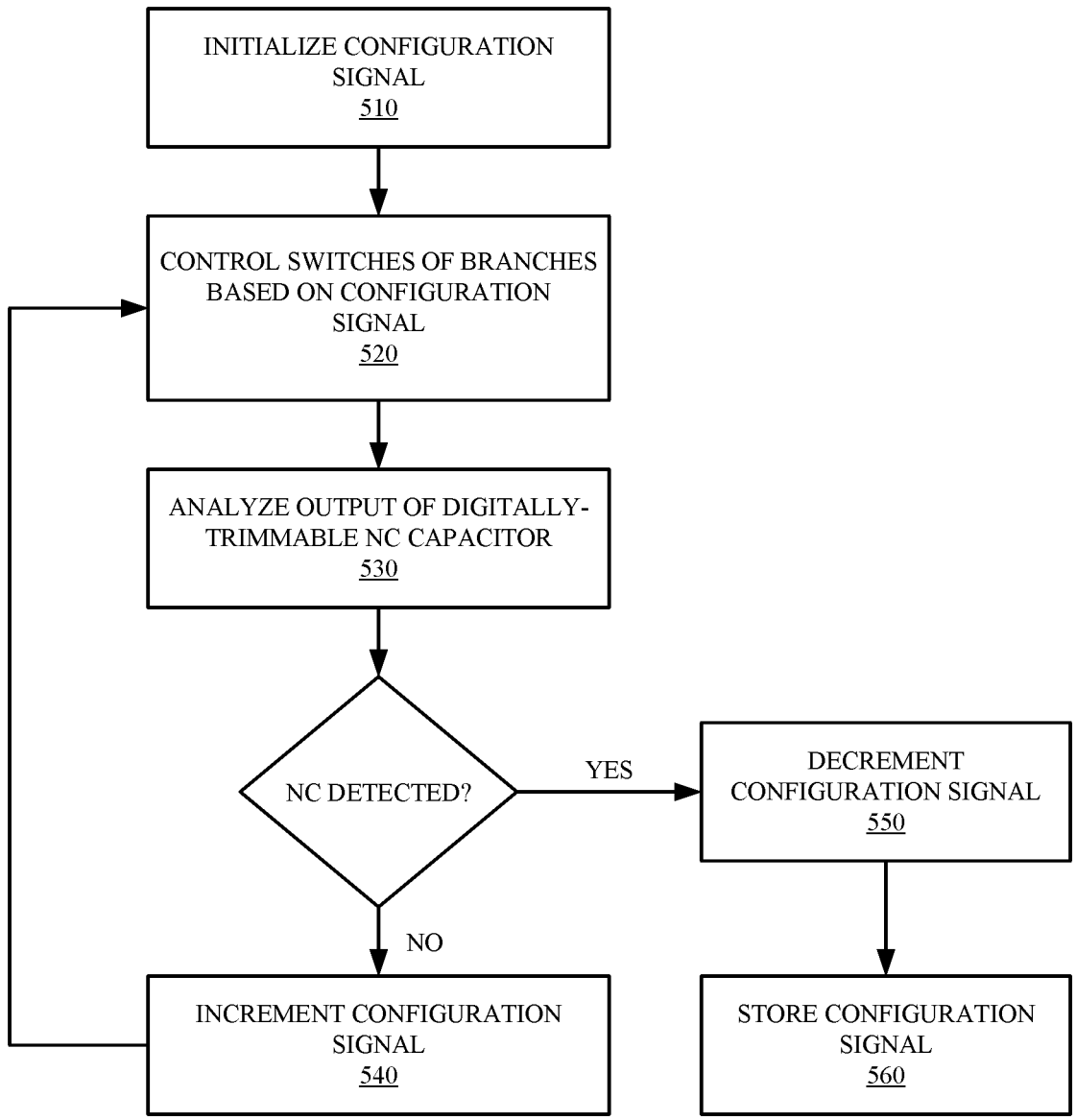
FIG. 5 illustrates a flow diagram of a process for configuring a digitally-trimmable NC capacitor, according to one embodiment.

FIG. 5 illustrates a flow diagram of a process for configuring a digitally-trimmable negative-capacitance (NC) capacitor, according to one embodiment. In some embodiments, the digitally-trimmable NC capacitor 300 is configured during startup of a system using the extended bandwidth amplifier 200. For example, the digitally-trimmable NC capacitor 300 may be configured when the system using the extended bandwidth amplifier 200 is powered on. In some embodiments, the digitally-trimmable NC capacitor 300 is periodically recalibrated during the operation of the extended bandwidth amplifier 200 to account for drifts in the capacitances of the amplifier 220. In yet other embodiments, the digitally-trimmable NC capacitor 300 is configured once during manufacturing of the extended bandwidth amplifier 200 and the configuration of the digitally-trimmable NC capacitor 300 is stored for subsequent uses of the extended bandwidth amplifier 200.

The controller 330 initializes 510 the value of configuration signal $[S_1:S_n]$. In some embodiments, each bit of the configuration signal corresponds to a branch of the digitally-trimmable NC capacitor.

In some embodiments, the configuration signal is initialized to have a value of 1. That is, the configuration signal is initialized to have an active value for a bit corresponding to the first branch, and have an inactive value for the bits corresponding to the other branches of the capacitor bank 310 of the digitally-trimmable NC capacitor 300 (i.e., the second branch through the n-th branch of the digitally-trimmable NC capacitor).

The switches of each of the branches of the capacitor bank 310 of the digitally-trimmable NC capacitor 300 are controlled 520 based on the configuration signal. That is, each of the switches are opened or closed based on the value of the configuration signal. In some embodiments, a switch is opened if a corresponding bit of the configuration signal has an inactive value, and closed if the corresponding bit of the configuration signal has an active value. That is, for an i-th branch of the digitally-trimmable NC capacitor, the switch S of the i-th branch is opened if the i-th bit $S_i$ of the configuration signal has an inactive value (e.g., 0), and closed if the i-th bit $S_i$ of the configuration signal has an active value (e.g., 1).

The controller 330 analyzes 530 the output of the capacitor bank 310 of the digitally-trimmable NC capacitor 300. The controller 330 may apply an input voltage or an input current to the capacitor bank 310 and the controller may sense the response from the capacitor bank 310 to the applied input voltage or input current. For example, the controller 330 may sense an output voltage or an output current in response to the applied input voltage or input current. The controller 330 then determines if the response of the capacitor bank 310 is consistent with the response of a negative capacitance. For example, the controller 330 may determine if a drop in a voltage waveform is present in the output of the capacitor bank 310.

If the controller does not detect a negative capacitance, the configuration signal is incremented 540. In some embodiments, the configuration signal is incrementing by incrementing the digital value of the configuration signal. This embodiment may be used when each of the branches 320 of the capacitor bank 310 of the digitally-trimmable NC capacitor 300 are configured to have a different capacitance value. In other embodiments, the configuration signal is incrementing by incrementing the number of bits that have an active value. For instance, the configuration signal may be incremented by shifting the configuration signal by 1. In another example, a logic gate that flips a value of an i-th bit $S_i$ to an active value if the i-th bit $S_i$ has an inactive value and the (i−1)-th bit has an active $S_{i-1}$ value may be used.

Based on the new configuration signal, the switches of each of the branches of the capacitor bank 310 of the digitally-trimmable NC capacitor 300 are controlled 520 and the output of the digitally-trimmable NC capacitor is analyzed 530. This process may be iteratively repeated until a negative capacitance is detected, or until the maximum value for the configuration signal is reached. That is, the controller sweeps the capacitance value of the digitally-trimmable NC capacitor 300 until a negative capacitance is detected, or until the maximum value for the capacitance of the digitally-trimmable NC capacitor 300 is reached.

If the controller detects a negative capacitance, the configuration signal is decremented. That is, the configuration signal is decremented to a previous value for which a negative capacitance was not detected in the output of the digitally-trimmable NC capacitor 300. In some embodiments, the final configuration signal is additionally stored 560 to be used during normal operation of the extended bandwidth amplifier 200.

Figure 6:
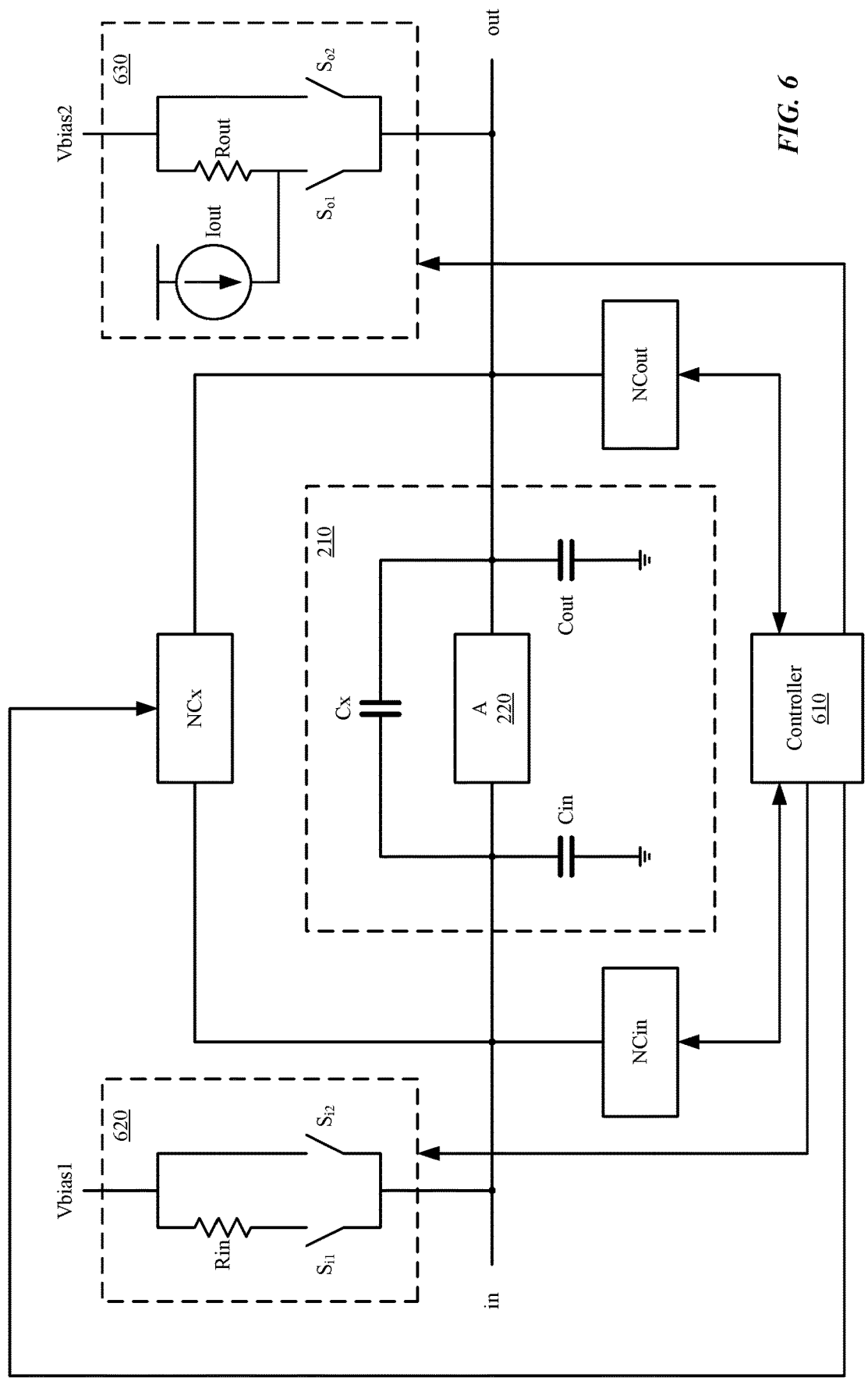
FIG. 6 illustrates a block diagram of a system for configuring an input NC capacitor, an output NC capacitor, and an input-output NC capacitor, according to one embodiment.

FIG. 6 illustrates a block diagram of a system for configuring an input NC capacitor NCin, and output NC capacitor NCout, and an input-output NC capacitor NCx, according to one embodiment. As shown in FIG. 6, each of the NC capacitors (NCin, NCout, and NCx) are digitally-trimmable NC capacitors. As such, each of the NC capacitors (NCin, NCout, and NCx) are calibrated to counteract a corresponding capacitance (Cin, Cout, and Cx) of the amplifier 210.

In order to counteract the effect of each of the capacitances of the amplifier 210, the value of each of those capacitances is determined. For example, a negative capacitance NCin is determined for counteracting the effect of the input capacitance Cin of the amplifier 210, a negative capacitance NCout is determined for counteracting the effect of the output capacitance Cout of the amplifier 210, and a negative capacitance NCx is determined for counteracting the effect of the input-output capacitance Cx.

However, since the various capacitances (Cin, Cout, Cx) of the amplifier 210 cannot be removed from the amplifier 210, when each of the digitally-trimmable NC capacitors are being configured, the value of each of the capacitances (Cin, Cout, Cx) of the amplifier 210 will affect the calculation of each of the NC capacitors (NCin, NCout, NCx). That is, when trying to calculate the value of the input capacitance Cin of the amplifier 210, the values of other capacitances (Cx and Cout) may affect the result of the calculation. Similarly, when trying to calculate the value of the output capacitance Cout of the amplifier 210, the values of other capacitances (Cx and Cin) may affect the result of the calculation.

As shown in FIG. 6, the system for configuring the digitally-trimmable NC capacitors NCin, NCout, and NCx may include, among other components, an input biasing circuit 620, an output biasing circuit 630, and a controller 610 for controlling the input biasing circuit 620, the output biasing circuit 630, as well as digitally-trimmable NC capacitors NCin, NCout, and NCx.

The input biasing circuit 620 includes a first switch $S_{i1}$ having a first terminal coupled to the input terminal of the amplifier circuit 220, and a second terminal coupled to a resistor Rin. Moreover, resistor Rin is coupled to an input bias voltage Vbias1. Additionally, the input biasing circuit 620 includes a second switch $S_{i2}$ having a first terminal coupled to the input terminal of the amplifier circuit 220, and a second terminal coupled to the input bias voltage Vbias2.

The output biasing circuit 630 includes a first switch $S_{o1}$ having a first terminal coupled to the output terminal of the amplifier circuit 220, and a second terminal coupled to a resistor Rout. Moreover, resistor Rout is coupled to an output bias voltage Vbias2. In some embodiments, the first switch $S_{o1}$ is additionally coupled to a current source Tout. Additionally, the output biasing circuit 630 includes a second switch $S_{o2}$ having a first terminal coupled to the output terminal of the amplifier circuit 220, and a second terminal coupled to the output bias voltage Vbias2.

To determine the values of Cin, Cout, and Cx, multiple measurements are performed. For example, the controller 610 controls the biasing circuits 620 and 630 and controls the controllers 330 of one or more of the digitally-trimmable NC capacitors 300 (NCin, NCout, and NCx) to determine an approximate value of the capacitances (Cin, Cout, and Cx) of the amplifier 210.

For example, first, the controller 610 may close the first switch $S_{i1}$ of the input biasing circuit 620 and keeps switches $S_{i2}$, $S_{o1}$, $S_{o2}$ open. The controller 610 then instructs the output NC capacitor NCout to determine a value of a capacitance seen from the output terminal of the amplifier 210. In some embodiments, the output NC capacitor NCout applies the process described in FIG. 5 to determine the capacitance seen from the output terminal of the amplifier 210. Since capacitances Cin and Cx are present, instead of directly measuring the output capacitance Cout, the output NC capacitor NCout senses the capacitance value C1 of the combination of Cin, Cout, and Cx as follows:

$$C_1 = C_{out} + \frac{C_x C_{in}}{C_x + C_{in}} \quad (8)$$

Similarly, the controller 610 may close the second switch $S_{i2}$ of the input biasing circuit 620 and keeps switches $S_{i1}$, $S_{o1}$, $S_{o2}$ open. By closing the second switch $S_{i2}$, the input biasing circuit 620 connects the input terminal of the amplifier 210 directly to the biasing voltage Vbias1. In this manner, the input terminal of the amplifier 210 is connected to an AC ground. The controller 610 then instructs the output NC capacitor NCout to determine a value of a capacitance seen from the output terminal of the amplifier 210. In some embodiments, the output NC capacitor NCout applies the process described in FIG. 5 to determine the capacitance seen from the output terminal of the amplifier 210. Although the input capacitance is shorted to ground by the input biasing circuit 620, since the input-output capacitance Cx is still present, instead of directly measuring the output capacitance Cout, the output NC capacitor NCout senses the capacitance value C2 of the combination of Cout and Cx as follows:

$$C_2 = C_{out} = C_x \quad (9)$$

Additionally, the controller 610 controls the output biasing circuit 630. For example, the controller 610 closes the first switch $S_{o1}$ of the output biasing circuit and keeps switches $S_{i1}$, $S_{i2}$, $S_{o2}$ open. The controller 610 then instructs the input NC capacitor NCin to determine a value of a capacitance seen from the input terminal of the amplifier 210. In some embodiments, the input NC capacitor NCin applies the process described in FIG. 5 to determine the capacitance seen from the input terminal of the amplifier 210. Since capacitances Cout and Cx are present, instead of directly measuring the input capacitance Cin, the input NC capacitor NCin senses the capacitance value C3 of the combination of Cin, Cout, and Cx as follows:

$$C_3 = C_{in} + \frac{C_x C_{out}}{C_x + C_{out}} \quad (10)$$

Finally, the controller 610 may also close the second switch $S_{o2}$ of the output biasing circuit and keeps switches $S_{i1}$, $S_{i2}$, $S_{o1}$ open. By closing the second switch $S_{o2}$, the output biasing circuit 630 connects the output terminal of the amplifier 210 directly to the biasing voltage Vbias2. In this manner, the output terminal of the amplifier 210 is connected to an AC ground. The controller 610 then instructs the input NC capacitor NCin to determine a value of a capacitance seen from the input terminal of the amplifier 210. In some embodiments, the input NC capacitor NCin applies the process described in FIG. 5 to determine the capacitance seen from the input terminal of the amplifier 210. Although the output capacitance is shorted to ground by the output biasing circuit 630, since the input-output capacitance Cx is still present, instead of directly measuring the input capacitance Cin the input NC capacitor NCin senses the capacitance value C4 of the combination of Cin and Cx as follows:

$$C_4 = C_{in} + C_x \quad (11)$$

Based on equations (8) through (11), the controller 610 determines the value of Cin, Cou, and Cx. For example, the controller 610 may be configured to solve a system of equations. For example, using equations (9) through (11), Cx may be determined as:

$$C_x = \sqrt{C_2(C_4 - C_3)} \quad (12)$$

And, Cin and Cout are determined as:

$$C_{in} = C_4 - C_x = C_4 - \sqrt{C_2(C_4 - C_3)} \quad (13)$$

$$C_{out} = C_2 - Cx = C_2 - \sqrt{C_2(C_4 - C_3)} \quad (14)$$

Alternatively, using equations (8), (9), and (11), Cx may be determined as:

$$C_x = \sqrt{C_4(C_2 - C_1)} \quad (15)$$

And, Cin and Cout are determined as:

$$C_{in} = C_4 - C_x = C_4 - \sqrt{C_4(C_2 - C_1)} \quad (16)$$

$$C_{out} = C_2 - Cx = C_2 - \sqrt{C_4(C_2 - C_1)} \quad (17)$$

In some embodiments, after determined the values of Cin, Cout, and Cx, the controller 610 controls each of the digitally-trimmable NC capacitors NCin, NCout, and NCx to have a corresponding negative capacitance.

Figure 7:
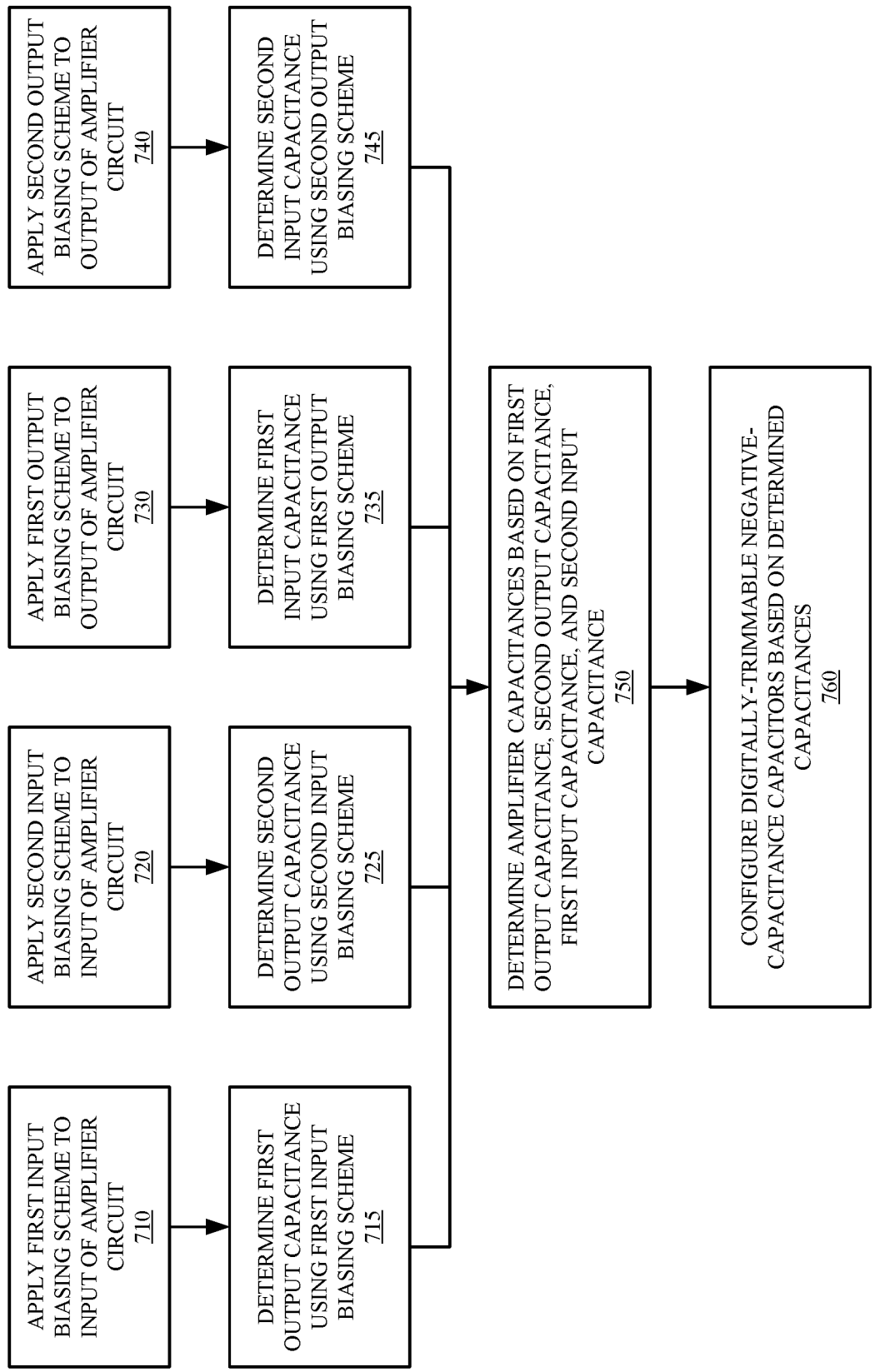
FIG. 7 illustrates a flow diagram of a process for configuring multiple digitally-trimmable negative-capacitance capacitor to be used with an amplifier circuit, according to one embodiment.

FIG. 7 illustrates a flow diagram of a process for configuring multiple digitally-trimmable NC capacitor to be used with an amplifier circuit, according to one embodiment.

The controller 610 applies 710 a first input biasing scheme to the input of the amplifier circuit 210. For example, the controller 610 controls the input biasing circuit 620 (e.g., by closing the first switch $S_{i1}$ and opening the second switch $S_{i2}$) to apply the first input biasing scheme. The controller 610 then controls output NC capacitor NCout to determine 715 a first output capacitance C1 using the first input biasing scheme. For example, the output NC capacitor NCout uses the process of FIG. 5 to determine the value of the first output capacitance C1.

The controller 610 applies 720 a second input biasing scheme to the input of the amplifier circuit 210. For example, the controller 610 controls the input biasing circuit 620 (e.g., by opening the first switch $S_{i1}$ and closing the second switch $S_{i2}$) to apply the second input biasing scheme. The controller 610 then controls output NC capacitor NCout to determine 725 a second output capacitance C2 using the second input biasing scheme. For example, the output NC capacitor NCout uses the process of FIG. 5 to determine the value of the second output capacitance C2.

The controller 610 applies 730 a first output biasing scheme to the output of the amplifier circuit 210. For example, the controller 610 controls the output biasing circuit 620 (e.g., by closing the first switch $S_{o1}$ and opening the second switch $S_{o2}$) to apply the first output biasing scheme. The controller 610 then controls input NC capacitor NCin to determine 735 a first input capacitance C3 using the first output biasing scheme. For example, the input NC capacitor NCin uses the process of FIG. 5 to determine the value of the first input capacitance C3.

The controller 610 applies 740 a second output biasing scheme to the output of the amplifier circuit 210. For example, the controller 610 controls the output biasing circuit 620 (e.g., by opening the first switch $S_{o1}$ and closing the second switch $S_{o2}$) to apply the second output biasing scheme. The controller 610 then controls input NC capacitor NCin to determine 745 a second input capacitance C4 using the second output biasing scheme. For example, the input NC capacitor NCin uses the process of FIG. 5 to determine the value of the second input capacitance C4.

Based on the values of the first output capacitance C1, the second output capacitance C2, the first input capacitance C3, and the second input capacitance C4, the controller 610 determines 750 the input capacitance Cin, output capacitance Cout, and the input-output capacitance Cx of the amplifier circuit 210. The controller 610 then configures the input NC capacitor NCin, the output NC capacitor NCout, and the input-output NC capacitor NCx to have negative capacitances corresponding to the determined capacitances.

In some embodiments, during calibration of the digitally-trimmable NC capacitors, the amplifier circuit 210 is disconnected from a power supply. For example, the amplifier circuit 210 may be connected to the power supply through a switch. The controller 610 then opens the switch prior to the start of the calibration process, and closes the switch after the calibration process is completed.

While particular embodiments and applications have been illustrated and described, it is to be understood that the invention is not limited to the precise construction and components disclosed herein and that various modifications, changes and variations which will be apparent to those skilled in the art may be made in the arrangement, operation and details of the method and apparatus disclosed herein without departing from the spirit and scope of the present disclosure.

What is claimed is:

1. An extended bandwidth amplifier circuit having an input node and an output node, the amplifier circuit comprising:
   an amplifier circuit coupled between the input node and the output node of the extended bandwidth amplifier circuit, the amplifier circuit having an input capacitance and an output capacitance;
   a first negative-capacitance capacitor coupled to the input node of the extended bandwidth amplifier circuit in parallel with the input capacitance, the first negative-capacitance capacitor compensating the input capacitance of the amplifier circuit;
   a second negative-capacitance capacitor coupled to the output node of the extended bandwidth amplifier circuit in parallel with the output capacitance, the second negative-capacitance capacitor compensating the output capacitance of the amplifier circuit; and
   a third negative-capacitance capacitor coupled between the input node of the amplifier circuit and the output node of the amplifier circuit.

2. The extended bandwidth amplifier circuit of claim 1, wherein the input capacitance of the amplifier circuit and the output capacitance of the amplifier circuit include parasitic capacitances of a transistor of the amplifier circuit.

3. The extended bandwidth amplifier circuit of claim 1, wherein the first negative capacitance capacitor is digitally trimmable.

4. The extended bandwidth amplifier circuit of claim 1, wherein the first negative-capacitance capacitor comprises:
   a capacitor bank including:
      a first branch having a first capacitor and a first switch, the first capacitor having a first negative capacitance, and
      a second branch having a second capacitor and a second switch, the second capacitor having a second negative capacitance; and
   a controller configured to control the first switch and the second switch, the controller configured to turn on the first switch and the second switch based on the input capacitance of the amplifier.

5. The extended bandwidth amplifier circuit of claim 4, wherein controller of the first negative-capacitance capacitor comprises:
   a calibration engine configured to control a current source for providing a calibration current to at least the first branch of the first negative-capacitance capacitor; and
   a detector circuit configured to detect a decrease in a voltage generated in response to the calibration current.

6. The extended bandwidth amplifier circuit of claim 5, wherein the calibration engine is further configured to generate a configuration signal to turn on or off the first switch of the first branch of the first negative-capacitance capacitor and turn on or off the second switch of the second branch of the first digitally-trimmable negative-capacitance capacitor in response to receiving a signal from the detector indicating a presence or absence of a decrease in the voltage generated in response to the calibration current, wherein the configuration signal comprises a plurality of bits including:
   a first bit for controlling the first switch of the first branch of the first digitally-trimmable negative-capacitance capacitor; and
   a second bit for controlling the second switch of the second branch of the first digitally-trimmable negative-capacitance capacitor.

7. The extended bandwidth amplifier circuit of claim 6, wherein the calibration engine is configured to increase a digital value of calibration signal in response to receiving a signal from the detector indicating an absence of a decrease in the voltage generated in response to the calibration current, and wherein the calibration engine is configured to decrease the digital value of calibration signal in response to receiving a signal from the detector indicating a presence of a decrease in the voltage generated in response to the calibration current.

8. The extended bandwidth amplifier circuit of claim 1, further comprising:
   an output biasing circuit coupled to the output node, the output biasing circuit comprising:
      a first switch for connecting the output node to an output bias voltage; and
      a second switch for connecting the output node to the output bias voltage through a resistive element.

9. The extended bandwidth amplifier circuit of claim 8, further comprising:
   a controller circuit configured to:
   close the first switch of the output biasing circuit and control the first negative-capacitance capacitor to determine a first capacitance value by sweeping a capacitance value of the first negative-capacitance capacitor until a first negative capacitance is detected at the input of the amplifier circuit;
   close the second switch of the output biasing circuit and control the first digitally-trimmable negative-capacitance capacitor to determine a second capacitance value by sweeping the capacitance value of the first digitally-trimmable negative-capacitance capacitor until a second negative capacitance is detected at the input of the amplifier circuit; and
   determine the input capacitance of the amplifier circuit and the output capacitance of the amplifier circuit based at least on the determined first and second capacitance values.

10. A method for extending bandwidth of an amplifier circuit, comprising:
    operating the amplifier circuit, the amplifier having an input node and an output node, the amplifier circuit further having an input capacitance and an output capacitance; and
    calibrating a first negative-capacitance capacitor coupled to the input node of the amplifier circuit in parallel with the input capacitance to compensate the input capacitance of the amplifier circuit.

11. The method of claim 10, wherein calibrating the first negative-capacitance capacitor comprises:
   closing a first switch of a first branch of the first negative-capacitance capacitor responsive to determining that the input capacitance of the amplifier has a first capacitance value, the first branch including a first capacitor having a first negative capacitance; and
   closing a second switch of a second branch of the first negative-capacitance capacitor responsive to determining that the input capacitance of the amplifier has a second capacitance value, the second branch including a second capacitor having a second negative capacitance.

12. The method of claim 11, wherein calibrating the first negative-capacitance capacitor further comprises:
   generating a configuration signal to turn on or off the first switch of the first branch of the first negative-capacitance capacitor and turn on or off the second switch of the second branch of the first negative-capacitance capacitor, the configuration signal generated based on the analysis of the calibration voltage;
   controlling the first switch of the first branch of the first negative-capacitance capacitor based on a first bit of the calibration signal; and
   controlling the second switch of the second branch of the first negative-capacitance capacitor based on a second bit of the calibration signal.

13. The method of claim 12, wherein generating a configuration signal comprises:
   increasing a digital value of calibration signal in response to not detecting a drop in the calibration voltage, and
   decreasing the digital value of calibration signal in response to detecting a drop in the calibration voltage.

14. The method of claim 10, further comprising:
   closing a first switch of an output biasing circuit and controlling the first negative-capacitance capacitor to determine a first capacitance value by sweeping a capacitance value of the first negative-capacitance capacitor until a first negative capacitance is detected at the input node of the amplifier circuit;
   closing a second switch of the output biasing circuit and controlling the first negative-capacitance capacitor to determine a second capacitance value by sweeping the capacitance value of the first negative-capacitance capacitor until a second negative capacitance is detected at the input node of the amplifier circuit; and
   determining the input capacitance of the amplifier circuit and the output capacitance of the amplifier circuit based at least on the determined first and second capacitance values.

15. A digitally-trimmable negative-capacitance capacitor, comprising:
   a capacitor bank having plurality of branches including:
      a first branch having a first capacitor and a first switch, the first capacitor having a first negative capacitance, and
      a second branch having a second capacitor and a second switch, the second capacitor having a second negative capacitance; and
   a controller configured to control the first switch and the second switch, the controller configured to turn on the first switch and the second switch based on an input capacitance of an amplifier circuit.

16. The digitally-trimmable negative-capacitance capacitor of claim 15, wherein the calibration engine is further configured to generate a configuration signal to turn on or off the first switch of the first branch of the digitally-trimmable negative-capacitance capacitor and turn on or off the second switch of the second branch of the digitally-trimmable negative-capacitance capacitor in response to receiving a signal from the detector indicating a presence or absence of a decrease in the voltage generated in response to the calibration current, wherein the configuration signal comprises a plurality of bits including:
   a first bit for controlling the first switch of the first branch of the digitally-trimmable negative-capacitance capacitor; and
   a second bit for controlling the second switch of the second branch of the digitally-trimmable negative-capacitance capacitor.

17. The digitally-trimmable negative-capacitance capacitor of claim 16, wherein the calibration engine is configured to increase a digital value of calibration signal in response to receiving a signal from the detector indicating an absence of a decrease in the voltage generated in response to the calibration current, and wherein the calibration engine is configured to decrease the digital value of calibration signal in response to receiving a signal from the detector indicating a presence of a decrease in the voltage generated in response to the calibration current.

* * * * *